US011125802B2

(12) United States Patent
Winkelmann

(10) Patent No.: US 11,125,802 B2
(45) Date of Patent: Sep. 21, 2021

(54) METHOD AND TESTING DEVICE FOR MEASURING PARTIAL DISCHARGE PULSES OF A SHIELDED CABLE

(71) Applicant: Maschinenfabrik Reinhausen GmbH, Regensburg (DE)

(72) Inventor: Erik Winkelmann, Dresden (DE)

(73) Assignee: MASCHINENFABRIK REINHAUSEN GMBH, Regensburg (DE)

(*) Notice: Subject to any disclaimer, the term of this patent is extended or adjusted under 35 U.S.C. 154(b) by 85 days.

(21) Appl. No.: 16/632,903

(22) PCT Filed: Apr. 26, 2018

(86) PCT No.: PCT/EP2018/060698
§ 371 (c)(1),
(2) Date: Jan. 22, 2020

(87) PCT Pub. No.: WO2019/020225
PCT Pub. Date: Jan. 31, 2019

(65) Prior Publication Data
US 2020/0166561 A1 May 28, 2020

(30) Foreign Application Priority Data
Jul. 24, 2017 (DE) .................. 10 2017 116 613.0

(51) Int. Cl.
G01R 31/12 (2020.01)
G01R 31/08 (2020.01)
G01R 31/14 (2006.01)
(52) U.S. Cl.
CPC ........ *G01R 31/1272* (2013.01); *G01R 31/083* (2013.01); *G01R 31/14* (2013.01)

(58) Field of Classification Search
CPC ........ G01R 31/08–086; G01R 31/1272; G01R 31/14
See application file for complete search history.

(56) References Cited

U.S. PATENT DOCUMENTS 5,117,191 A * 5/1992 Saigo ................. G01R 31/1272
324/551
5,272,439 A * 12/1993 Mashikian ......... G01R 31/1272
324/520
(Continued)

FOREIGN PATENT DOCUMENTS

EP 1012612 A1 6/2000
EP 3106888 A1 12/2016
WO WO 9837427 A1 8/1998

OTHER PUBLICATIONS

Anonymous, "IEEE Guide for Partial Discharge Testing of Shield Power Cable Systems in a Field Environment," *OEEE Standard*: c1-36 (Feb. 5, 2007). XP017603950.
(Continued)

Primary Examiner — Patrick Assouad
Assistant Examiner — Demetrius R Pretlow
(74) Attorney, Agent, or Firm — Leydig, Voit & Mayer, Ltd.

(57) ABSTRACT

A method measures partial discharge pulses of a shielded cable, which has a core and a sheath. The method includes: connecting a coupling capacitor with a first connecting point of the core; providing a first, second, and third coupling unit, each having an input and a signal output; connecting the input of the first coupling unit with the coupling capacitor; connecting the input of the second coupling unit with a first connecting point of the sheath; connecting the input of the third coupling unit with a second connecting point of the sheath; providing a test voltage at the first connecting point of the core; acquiring respective measurement signals of the (Continued)

coupling units at their signal outputs; and determining at least one characteristic value for an apparent charge of a partial discharge pulse of the cable in dependence on the measurement signals.

15 Claims, 2 Drawing Sheets

(56) References Cited

U.S. PATENT DOCUMENTS

| | | | | |
|---|---|---|---|---|
| 5,323,117 | A * | 6/1994 | Endoh | G01R 31/1272 324/551 |
| 5,854,556 | A * | 12/1998 | Steennis | G01R 31/1272 324/541 |
| 6,366,095 | B1 * | 4/2002 | Van Aartrijk | G01R 31/1272 324/535 |
| 7,112,968 | B1 | 9/2006 | Nishizawa | |
| 2002/0024341 | A1 * | 2/2002 | Rokunohe | G01R 31/1272 324/536 |
| 2003/0206111 | A1 * | 11/2003 | Gao | G01R 31/1272 340/635 |
| 2006/0038573 | A1 * | 2/2006 | Sarkozi | G01R 31/1272 324/536 |
| 2008/0048668 | A1 * | 2/2008 | Mashikian | G01R 31/1272 324/533 |
| 2011/0204899 | A1 * | 8/2011 | Klapper | G01R 31/1272 324/532 |
| 2013/0211750 | A1 * | 8/2013 | Garnacho Vecino | G06F 17/148 702/59 |
| 2013/0241571 | A1 * | 9/2013 | Oiwa | G01R 31/58 324/543 |
| 2014/0002098 | A1 * | 1/2014 | Sales Casals | G01R 31/08 324/521 |
| 2014/0125353 | A1 * | 5/2014 | Shu | G01R 15/16 324/551 |
| 2017/0205459 | A1 * | 7/2017 | De Rai | H02G 15/1055 |
| 2019/0056447 | A1 * | 2/2019 | Candela | G01R 31/08 |

OTHER PUBLICATIONS

Tian, et al. "Partial Discharge Detection in High Voltage Cables Using VHF Capacitive Coupler and Screen Interruption Techniques," *Conference Record of the 2002 IEEE International Symposium on Electrical Insulation*: 87-90 (Apr. 7, 2002). XP010588802.

Tian, et al. "Partial Discharge Detection in Cables Using VHF Capacitive Couplers," *IEEE Transactions on Dielectrics and Electrical Insulation* 10, 2: 343-353 (Apr. 1, 2003). XP055494603.

Anonymous, "International Standard IEC 60270, High-Voltage Test Techniques—Partial Discharge Measurements": 1-99 (Dec. 21, 2000). XP055225178.

Phung, et al. "Practical Experience in On-Line Partial Discharge Monitoring of Power Cables," *Universities Power Engineering Conference 2008*: 1-5 (Dec. 14, 2008). XP031448325.

Macedo, et al. "Wavelet Transform Processing Applied to Partial Discharge Evaluation," *Journal of Physics: Conference Series* 364, 1 (May 28, 2012). XP020223136.

* cited by examiner

METHOD AND TESTING DEVICE FOR MEASURING PARTIAL DISCHARGE PULSES OF A SHIELDED CABLE

CROSS-REFERENCE TO PRIOR APPLICATIONS

This application is a U.S. National Phase Application under 35 U.S.C. § 371 of International Application No. PCT/EP2018/060698, filed on Apr. 26, 2018, and claims benefit to German Patent Application No. DE 10 2017 116 613.0, filed on Jul. 24, 2017. The International Application was published in German on Jan. 31, 2019 as WO 2019/020225 under PCT Article 21(2).

FIELD

The present invention relates to a method and a testing device for measurement of partial discharge pulses of a shielded cable.

BACKGROUND

Repeated reference is made in the following to the International Standard IEC 60270. Such a reference is always to be understand as a reference to IEC 60270:2000+Cor.:2001+A1:2015, thus to the Standard in the third issue of 2000 inclusive of associated Corrigendum 1 of 2001 and Amendment A1 of 2015. The German-language Standard DIN EN 60270:2001+A1:2016 corresponds therewith. Unless expressly differently described, all terminology used in the following is to be understood in the sense of the Standard IEC 60270.

Designated as partial discharge, PD, is a locally restricted electrical discharge which bridges over the insulation between conductors only partly, and which can, but does not necessarily, occur adjacent to a conductor. Partial discharges in shielded cables can be attributed to, for example, fault locations or inhomogeneities in the electrical insulation between core and sheath. Partial discharges contribute to ageing of the electrical insulation between core and sheath of shielded cables; and therefore, have a disadvantageous effect on the dielectric quality thereof, particularly the dielectric strength. In order to be able to guarantee the dielectric quality of shielded cables, partial discharge measurements are undertaken, and with the help of these, especially, the characteristic value for the apparent charge of a partial discharge is determined.

Such partial discharge measurements can be carried out in accordance with IEC 60270. In that case, a coupling branch consisting of a coupling capacitor and a measuring impedance is connected in parallel with the test object between high-voltage source and an earth connection. Typically the high-voltage source is then connected with the core and the sheath earthed. The sensitivity of this arrangement is, in that case, determined by the ratio of the capacitances of the coupling capacitor and the test object. However, due to the sometimes considerable length of the cable to be tested (up to several kilometres), the capacitance of the coupling capacitor during testing of shielded cables is usually significantly less than the capacitance of the test object. This leads to a substantial reduction in the sensitivity of the measurement. In addition, discharges arising at a great distance from the measurement point are detected only fractionally since corresponding partial discharge pulses are appreciably attenuated due to the signal dispersion; and thus, a large part of the discharge energy drains away undetected through the capacitance between core and sheath and earth connection. This leads to inaccuracy and unreliability of the measurement. Moreover, localisation of the partial discharge is not possible (or is possible only extremely imprecisely) due to the signal dispersion and influence of disturbances and noise.

SUMMARY

An embodiment of the present invention provides a method that measures partial discharge pulses of a shielded cable, which has a core and a sheath. The method includes: connecting a coupling capacitor with a first connecting point of the core; providing a first, second, and third coupling unit, each having an input and a signal output; connecting the input of the first coupling unit with the coupling capacitor; connecting the input of the second coupling unit with a first connecting point of the sheath; connecting the input of the third coupling unit with a second connecting point of the sheath; providing a test voltage at the first connecting point of the core; acquiring respective measurement signals of the coupling units at their signal outputs; and determining at least one characteristic value for an apparent charge of a partial discharge pulse of the cable in dependence on the measurement signals.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
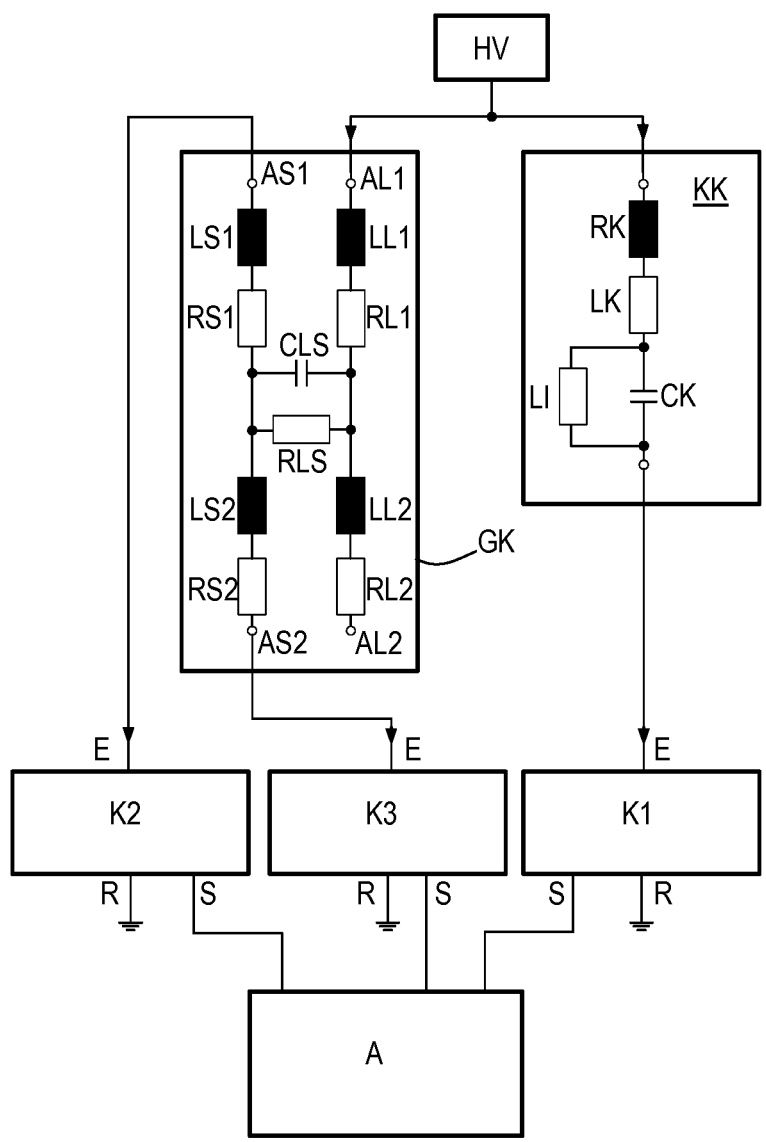
FIG. 1 shows a block circuit diagram of an exemplifying form of embodiment of a testing device according to the improved concept, with a shielded cable.

Embodiments of the present invention provide an improved concept for partial discharge measurements at shielded cables, which enables increased sensitivity and accuracy of the measurement.

The improved concept relates to a method from the field of high-voltage testing technology and to a corresponding testing device. Accordingly, all described components are to be understood as components suitable for use in high-voltage testing technology. A voltage of 1,000 volts or more is to be understood by high voltage. Unless described otherwise, "connecting" or "connection" always at least also means "electrical connecting" or "electrical connection".

The improved concept is based on the idea of not connecting the sheath of the cable with the earth connection for the measurement, but of providing—additionally to a coupling branch which is connected or connectible with the core and which includes a coupling capacitor and a coupling unit—instead at least two measuring branches in that at least two further coupling units can be connected with different points of the sheath. As a result, on the one hand, draining of the discharge energy to ground via the sheath is effectively suppressed since the coupling units, due to the high-frequency nature of the partial discharge pulses, have a blocking action relative thereto. On the other hand, the two measuring branches deliver measurement signals additionally to the measurement signal from the coupling branch. On the basis of the thus-available measurement signals, it is possible to determine a characteristic value for the apparent charge of the partial discharge pulse with a particularly high level of sensitivity and accuracy.

According to the improved concept, a method for measuring partial discharge pulses for a shielded cable, particularly for determination of a characteristic value for an apparent charge of a partial discharge pulse of the cable, is indicated, the cable including a core and a sheath, which are electrically insulated from one another.

According to the method, a first connection of a coupling capacitor is connected with a first connecting point of the core, which, for example, is arranged at a first end of the cable. In that case, the coupling capacitor is constructed as, in particular, a high-voltage capacitor. A first, a second, and a third coupling unit are provided, the coupling units each having an input and a signal output.

The input of the first coupling unit is connected with a second connection of the coupling capacitor. The input of the second coupling unit is connected with a first connecting point of the sheath and the input of the third coupling unit with a second connecting point, particularly a connecting point spatially remote from the first connecting point, of the sheath.

Respective reference connections of the coupling units can, for example, be connected with a reference potential, which can be, for example, ground potential. Thus, through the resulting series circuit, consisting of the coupling capacitor and first coupling unit, a coupling branch is formed and, through the second and third coupling units, a respective measuring branch of the testing device is formed. In the language of high-voltage testing technology, coupling units can also be termed coupling quadrupoles.

A test voltage, particularly a test voltage pulse consisting of one or more high-voltage individual pulses, is provided at the first connection point of the core. At the signal output of each coupling unit an associated measurement signal of the respective coupling unit is acquired.

The test voltage is, in particular, an alternating voltage, for example with a frequency of 0 to 500 Hz. However, in different forms of embodiment use can alternatively be made of direct voltage as test voltage. The test voltage is provided by, especially, a high-voltage source which is connected with the first connecting point of the core directly or by way of at least one blocking impedance and/or by way of an input filter. The blocking impedance and/or the input filter can serve the purpose of decoupling the high-voltage source from the rest of the test structure.

Each coupling unit is, for example, arranged for the purpose of converting an input signal, particularly a current signal, at its input into the associated measurement signal, which can be, in particular, a voltage signal, at its signal output. In that case, the current can be caused by, especially, a partial discharge pulse in the cable, which arises as a consequence of the test voltage. The coupling capacitor ensures, for example, recharging of a fault location which is the cause of the PD pulse.

Depending on the measurement signals, for example on one, two or three of the measurement signals, at least one characteristic value for an apparent charge of the partial discharge pulse is determined. The at least one characteristic value is, for example, equal to the apparent charge or a value proportional thereto.

According to at least one form of embodiment, each of the coupling units includes an inductive element arranged between the input and the reference connection of the respective coupling unit. The inductive element can be configured as, for example, an adaptable inductance. Alternatively, the inductive element can be configured as a current converter, especially as a high-frequency current transformer, thus HFCT.

Through the provision of the coupling branch and the two measurement branches, a multi-channel measuring method is indicated, which can be calibrated in accordance with, in particular, IEC 60270. In that case, use is made of the analogy of the construction of the coupling capacitor and of the shielded cable to be tested, which represents an object with distributed elements, particularly distributed resistances, capacitances and inductances. The distributed inductance and distributed capacitance resulting from the distributed elements of the cable are assisted by the introduction of the coupling units. Like the shielded cable, a high-voltage capacitor also includes distributed capacitances and inductances.

The inductive elements of the coupling units have the effect that not only the coupling branch, but also the two measurement branches have a blocking behaviour relative to PD pulses in such a way that the PD current cannot drain or drains only to a small extent to ground. This is due to the fact that PD pulses inherently can have very short rise times in the order or magnitude of 1 ns, and therefore, lead to high-frequency transient pulses, which can have, for example, frequencies in the range of 10 kHz to 10 MHz. The inductive elements thus represent a very high impedance for these pulses. Due to the fact that the PD current cannot drain to ground, a particularly large part of the PD current flows through the coupling capacitor, and accordingly, can be detected with increased sensitivity and accuracy by the first coupling unit. In addition, the second and third coupling units can similarly each detect a part of the PD current so that the corresponding measurement signals can also be utilised for determination of the characteristic value for the apparent charge. For that purpose, the measurement signals of the coupling units can individually serve as the basis or they can be offset relative to and/or correlated with one another. The accuracy of the measurement is thereby further increased, since on the one hand the probability is increased that the PD occurs in spatial proximity to one of the coupling units and on the other hand influences due to disturbances or noise can also be reduced by comparison, offsetting and/or correlation of the different measurement signals.

In addition, the effect of dispersion of the PD pulses resulting from the attenuation by the cable is reduced, since shorter signal transit times can be achieved through providing a plurality of coupling units.

According to at least one form of embodiment, at least two, for example all, of the measurement signals are set against one another in order to determine the characteristic value for the apparent charge.

According to at least one form of embodiment each of the coupling units includes a filter element or filter network, which is arranged between the input and signal output of the respective coupling unit. In that case, the filter element has, for example, a high-pass or band-pass characteristic.

Possible limit frequencies for the high pass can be, for example, 30 kHz or 100 kHz. In turn, for example, for the band pass 100 kHz is possible as lower limit frequency and/or 500 kHz as upper limit frequency. Other limit frequencies are possible in correspondence with actual requirements.

According to at least one form of embodiment, the filter elements of the coupling units are constructed as adaptive filter elements and arranged for the purpose of adapting their respective frequency path to the shielded cable in such a way that transfer functions of the measuring branches and the coupling branch are matched to one another.

According to at least one form of embodiment, the first connecting point of the sheath is arranged at the first end of the cable. According to at least one form of embodiment, the second connecting point of the sheath is arranged at a second end, which is different from the first end, of the cable. The arrangement at the ends of the cable has, in particular, the advantage that the cores of the cable are especially easily accessible at the ends of the cable and therefore calibration through connection of a PD calibrator between core and sheath at one end of the cable is possible, which enables calibration in accordance with IEC 60270.

The evaluating unit includes, for example, at least one PD measuring instrument, particularly a broad-band PD measuring instrument.

According to at least one form of embodiment of the method, the determination of the at least one characteristic value for the apparent charge includes weighting of the measurement signal of the first coupling unit. In addition, the measurement signal of the second coupling unit and/or the measurement signal of the third coupling unit is or are weighted.

In accordance with at least one form of embodiment, respective digitalised measurement signals are generated by analog-to-digital conversion of the measurement signal of the first coupling unit and/or of the second coupling unit and/or of the third coupling unit.

According to at least one form of embodiment, a difference signal is formed by subtraction of the weighted measurement signal of the second coupling unit and/or of the weighted measurement signal of the third coupling unit from the weighted measurement signal of the first coupling unit. Alternatively, the difference signal is formed by subtraction of the digitalised weighted measurement signal of the second coupling unit and/or of the digitalised weighted measurement signal of the third coupling unit from the digitalised weighted measurement signal of the first coupling unit. A first characteristic value for the apparent charge is then determined from the difference signal.

According to at least one form of embodiment, a part of the difference signal or of a signal derived therefrom is then integrated. For example, a first half wave of the difference signal and/or at least a part of the absolute amount of the difference signal and/or the positive area components of the difference signal and/or the negative area components of the difference signal and/or a part of the Fourier spectrum of the difference signal can be integrated.

The result of the integration represents the first characteristic value for the apparent charge of the PD. Through setting the difference measurement signals against one another a particularly large proportion of the overall charge energy of the PD is taken into consideration. As a result, a particularly high degree of accuracy of the measurement is achieved. The accuracy is particularly high if all measurement signals are set against one another. It is also particularly advantageous that influences due to disturbances or noise can also be reduced by the setting against one another. The difference formation takes into consideration that the flow direction of the PD current in the coupling branch is opposite to that in the measurement branches due to the described arrangement.

In accordance with at least one form of embodiment, the determination of the at least one characteristic value for the apparent charge includes determination of at least one second characteristic value for the apparent charge from the measurement signal of the second coupling unit and/or the measurement signal of the third coupling unit.

According to at least one form of embodiment the determination of at least one second characteristic value includes generation of corresponding digitalised measurement signals through analog-to-digital conversion of the measurement signal of the first coupling unit and/or the measurement signal of the second coupling unit and/or the measurement signal of the third coupling unit. At least a part of each digitalised measurement signal or of a signal derived therefrom is then integrated. For example, a first half wave of the digitalised measurement signal and/or a part of the absolute amount of the digitalised measurement signal and/or a part of the Fourier spectrum of the digitalised measurement signal can be integrated.

The result of the integration represents the at least one second characteristic value for the apparent charge of the PD. Through determination of several characteristic values for the apparent charge in the described manner it is possible, for example, through selection or through mean-value formation, to achieve a verified and particularly accurate characteristic value for the apparent charge. For example, obviously erroneous or inaccurate characteristic values can be discarded. Due to the plurality of coupling units at different positions of the cable, the probability of highly satisfactory measurement values is increased.

According to at least one form of embodiment, the determination of the at least one second characteristic value includes weighting the measurement signal of the second coupling unit and the measurement signal of the third coupling unit and generation of a summation signal through addition of the weighted measurement signals of the second and third coupling units or the Fourier spectra thereof. According to at least one form of embodiment, the summation signal is generated by addition of the digitalised weighted measurement signals of the second and third coupling units or the Fourier spectra thereof. The second characteristic value is then determined from the summation signal.

According to at least one form of embodiment, for determination of the second characteristic value a digitalised summation signal is generated by analog-to-digital conversion of the summation signal.

At least a part of each summation signal or digitalised summation signal or a signal derived therefrom is then integrated. For example, a first half wave of the summation signal or digitalised summation signal and/or a part of the absolute amount of the summation signal or digitalised summation signal and/or the positive or negative area components of the said signals and/or a part of the Fourier spectrum of the summation signal or digitalised summation signal can be integrated.

The result of the integrations represents the at least one second characteristic value for the apparent charge of the PD. Through taking into consideration several measurement signals, a higher degree of accuracy of the measurement is thereby achieved.

The weighting of the measurement signals is achieved by, for example, multiplication of the measurement signals by respective weighting factors, where the weighting factors correspond with, for example, respective calibration factors from a calibration of the respective coupling unit in the described arrangement. Compensation for a difference between an actual charge measurable at a coupling unit and the apparent charge can be provided in such a calibration. Reference to IEC 6027 as well as to the description hereunder of a calibration method is made for further details.

According to at least one form of embodiment, the measurement signals and/or the difference signal and/or the summation signal is or are filtered, particularly by low-pass filtering, before the analog-to-digital conversion, where a limit frequency of the low-pass filtering corresponds with a scanning frequency, particularly a maximum scanning frequency, of the analog-to-digital conversion. Alias effects in the digitalisation can thereby be reduced or prevented.

According to at least one form of embodiment, the difference signal and/or the summation signal and/or the digitalised summation signal and/or the digitalised measurement signals is or are filtered so as to define a measurement range. The measurement range can, for example, lie in the range 0 to 100 MHz or in the range 0 to 70 MHz. Advantageously, influences from disturbance signals are thereby reduced.

As an alternative to the described integrations, in other forms of embodiment, a peak value of the difference signal and/or of the summation signal and/or of the digital summation signal and/or the digitalised measurement signals is or are determined. The peak value then represents the first or second characteristic value.

In other forms of embodiment, phase information of the PD is also detected each time in parallel with the above-described pulse evaluation, in particular an instant of the PD referred to the supply voltage, which corresponds with, for example, a sine wave. Corresponding phase-resolved histograms which can be utilised for characterisation of the PD can then be generated from the respective phase data.

According to at least one form of embodiment, a first coupling unit is designed to conduct a current of 5 A or more at a frequency of 50 Hz. According to at least one form of embodiment, the second and third coupling units are respectively designed to conduct a current of 100 A or more, preferably 200 A or more, particularly preferably 500 A or more, at a frequency of 50 Hz. According to at least one form of embodiment the coupling units are designed for voltages with an amount of up to 2,000 V or more.

In accordance with at least one form of embodiment, one or more of the described analog-to-digital conversions is or are carried out with a synchronicity, particularly a synchronicity between the different measurement branches and, if relevant, the coupling branch, of less than 15 ns, preferably less than 10 ns, particularly preferably less than 5 ns.

According to at least one form of embodiment, a fourth coupling unit with an input and a signal output is provided and is constructed, for example, like the first coupling unit. A further coupling capacitor is connected with a second connecting point of the core and with the input of the fourth coupling unit. A measurement signal of the fourth coupling unit is obtained at the signal output thereof and a third characteristic value for the apparent charge is determined in dependence on the measurement signal of the fourth coupling unit.

According to at least one form of embodiment, the second connecting point of the core is arranged at the second end of the cable.

The determination of the third characteristic value can be carried out in a manner described for the determination of the first or second characteristic value, where the fourth coupling unit takes the place of the first coupling unit.

In accordance with at least one form of embodiment, the method includes determination of a first transit time from the measurement signal of the first coupling unit and/or the measurement signal of the second coupling unit. A second transit time is determined from the measurement signal of the third coupling unit. Localisation of the PD of the cable is then carried out based on the first and/or second transit time of the cable.

In that case, the transit times correspond with respective time intervals extending from a predetermined reference instant to the instant of detection of the respective measurement signal, for example up to occurrence of the peak value of the respective measurement signal. The transit times obviously differ due to the different spatial distance of the PD in the cable from the different coupling units or the associated connecting points at the sheath.

A direct conclusion about the local position of the origin of the PD in the cable can therefore be drawn from the transit time and the PD thus positioned and localised. In particular, the different transit times can be compared and one of the transit times can be selected for the localisation, for example the shortest transit time. Dispersion effects in the measurement can thereby be minimised and the measuring accuracy increased. Additionally or alternatively, the transit time can also be selected on the basis of other features of the respective measurement signal, for example the associated apparent charge and/or the associated peak value, so as to obtain the best possible measurement result.

According to at least one form of embodiment, the method includes generation of a correlated signal by formation of a cross-correlation between the measurement signals of the first and third coupling units or between the measurement signals of the second and third coupling units. A transit time is determined from the correlated signal and, based thereon, localisation of the PD is undertaken.

Alternatively or additionally to the transit time determination and localisation the correlated signal can be used for determination of the at least one characteristic value for the apparent charge analogously to the described procedure.

Disturbances and influences due to noise are reduced or eliminated by the cross-correlation, which leads to a further increase in measurement accuracy.

According to at least one form of embodiment, one or more further coupling units, which are, for example, of the same configuration as the second and third coupling units, are provided. The further coupling units are connected by the inputs thereof with respective further connecting points of the sheath, which points are preferably arranged between the first and second connecting points of the sheath. Respective measurement signals of the further coupling units are picked off at the respective signal outputs thereof and the at least one characteristic value for the apparent charge is determined in dependence on the measurement signals of the further coupling units.

In the determination of the at least one characteristic value in dependence on the measurement signals of the further coupling units, the measurement signals of the further coupling units are processed and used analogously to the measurement signals of the second and/or third coupling unit, as described. In particular, the measurement signals of the further coupling units are appropriately weighted as described.

The measurement signals of the further coupling units can be taken into consideration, especially, in the generation of the difference signal in that these are also subtracted from the measurement signal of the first coupling unit. Alternatively or additionally, for the determination of the second characteristic value the measurement signals of the further coupling units can be taken into consideration analogously to the measurement signals of the second and/or third coupling unit, in particular in the generation of the summation signal.

Alternatively or additionally and in accordance with at least one form of embodiment, for consideration in the determination of the at least one characteristic value for the apparent charge the localisation of the PD is carried out in dependence on the measurement signals of the further coupling units. For that purpose, a corresponding transit time, as described above, is determined for each of the measurement signals of the further coupling units.

In accordance with at least one form of embodiment, the transit times belonging to the measurement signals of the further coupling units are used analogously to those from the measurement signals of the second and/or third coupling unit in order to localise the PD.

In accordance with at least one form of embodiment the respective connecting points, with which the second, third and further coupling units are connected, at the sheath are arranged equidistantly.

According to at least one form of embodiment, at least three transit times associated with different connecting points at the sheath or corresponding coupling units are compared with one another. Localisation of the PD then includes spatial limitation of the PD to a position between those connecting points at the sheath for which the two shortest transit times were determined. The localisation is thereby possible in particularly simple manner and, for example, without further computation steps. Moreover, the part of the cable in which the PD was localised can be exchanged or removed. In advantageous manner, the higher the number of the further coupling units, the smaller the part of the cable to be removed.

Through the provision of the plurality of coupling units the influence of signal dispersion is reduced. Moreover, a real-time indication of a result of the localisation of the PD is thereby made possible.

According to at least one form of embodiment, the method includes calibration, particularly in accordance with IEC 60270 or in part according to IEC 60270, of at least one of the coupling units, particularly in the described testing system, before the steps of provision of the test voltage, acquisition of the measurement signals and determination of the at least one characteristic value are carried out.

According to at least one form of embodiment, the calibration includes determination of a calibration factor for at least one of the coupling units. The calibration factor corresponds with, for example, the weighting factor for the described weighting of the measurement signal of the coupling unit.

In accordance with at least one form of embodiment, for the calibration a calibration pulse is generated between the first connecting point of the core and one of the inputs of the coupling units and/or between the second connecting point of the core and one of the inputs of the coupling units and/or between a further connecting point of the core and one of the inputs of the coupling units. In that case, the further connecting point of the core corresponds with, in particular, a connecting point with which one of the coupling units is connected. A calibration signal attributable to, in particular, the calibration pulse is picked off at the signal output of at least one of the coupling units. A test value for the apparent charge of the calibration pulse is determined from the calibration signal. The test value is compared with a reference value for the apparent charge of the calibration pulse and the calibration factor for the coupling unit is determined from the comparison, where the calibration factor corresponds with, in particular, a ratio between the test value and reference value or a value proportional to the ratio.

According to at least one form of embodiment, the determination of the test value includes generation of a digitalised calibration signal by analog-to-digital conversion of the calibration signal and integration of at least a part of the digitalised calibration signal or of a signal derived therefrom. The integration is carried out, for example, as described with respect to the difference signal and/or the measurement signals. The different possibilities for filtering which were described with respect to the difference signal and/or the measurement signals are possible in corresponding manner for the calibration signal. The result of the integrations represents the calibration factor.

The integration of the digitalised calibration signal is preferably carried out in the same manner as the integration of the difference signal and/or summation signal and/or the digitalised measurement signals.

According to at least one form of embodiment, the determination of the reference value includes generation of a calibration signal between the input of the coupling unit and the reference potential, where the coupling unit is not connected with the cable, the high-voltage source, the coupling capacitor or another component of the described testing device. A reference signal is then picked off at the signal output of the coupling unit and the reference value is determined analogously to the described determination of the calibration factor.

According to at least one form of embodiment, the further connecting point of the core is disposed at a position of the core which corresponds with the position of the connecting point, with which the input of the coupling unit—which is calibrated—is connected, of the sheath.

In different forms of embodiment, at least one transmission function between two of the connecting points of the sheath and/or the core is determined for the calibration. Since the calibration pulse has a substantially constant spectrum, in particular of zero to approximately 10 MHz, a Fourier spectrum of the calibration signal acquired at the signal output of the at least one coupling unit represents a step response and thus a transmission function. In that case, it is a transmission function between the connecting point at which the calibrator is connected with the cable and the connecting point at which the said coupling unit is connected with the cable. Measuring of the transmission characteristics of the cable can thus be effectively carried out by the calibration.

If the connecting point of the sheath is not arranged at an end of the cable, the core can be contacted by means of, for example, a sleeve, with which the calibrator is connected. In particular, the calibration can then be carried out at the time of installation of the sleeve.

For generation of the calibration pulse use is made of, for example, a calibrator, particularly a calibrator according IEC 60270. The calibrator can be, for example, a generator which generates a step voltage and a capacitor connected in series therewith, so that the calibration pulse consists of a train of current or voltage pulses with predetermined strength.

A plurality of calibration factors in correspondence with the various possible arrangements of the calibrator is determined for each coupling unit through the described calibration. A particularly suitable calibration factor can then be selected, from this plurality of calibration factors, for the weighting of the measurement signal of the coupling unit, for example an arrangement of the calibrator is appropriately connected with the coupling unit as close as possible to the connecting point of the sheath. Alternatively, a mean value from the plurality of calibration factors can be used for the weighting.

In this way, a particularly accurate calibration, particularly according to IEC 60270, of the PD measurement is achieved.

In addition, according to the improved concept a testing device for measurement of partial discharge pulses of a shielded cable is indicated, the cable including a core and a sheath. The testing device includes a first, a second, and a third coupling unit, a coupling capacitor, a high-voltage source and an evaluating unit. The input of the second coupling unit is connectible or connected with a first connecting point of the sheath and the input of the third coupling unit is connectible or connected with a second connecting point of the sheath.

The high-voltage source has an output for connection of the high-voltage source with a first connecting point of the core. A first connection of the coupling capacitor is connected with the output of the high-voltage source and the input of the first coupling unit is connected with a second input of the coupling capacitor.

The evaluating unit is connected with each of the signal inputs of the first, second, and third coupling units. The evaluating unit is arranged for the purpose of obtaining associated measurement signals from the signal outputs of the coupling units and determining, in dependence on the measurement signals, at least one characteristic value for an apparent charge of a partial discharge pulse of the cable.

The evaluating unit is arranged for the purpose of determining the at least one characteristic value in accordance with a method according to the improved concept and/or of undertaking localisation of the PD in accordance with a method according to the improved concept.

According to corresponding forms of embodiment, the evaluating unit is arranged for the purpose of carrying out the different described filterings and other signal processing steps.

According to at least one form of embodiment, the testing device includes a fourth coupling unit, which has an input and a signal output, and a further coupling capacitor connectible with a second connecting point of the core, where the input of the fourth coupling unit is connected with the further coupling capacitor. The evaluating unit is arranged for the purpose of obtaining a measurement signal from the signal output of the fourth coupling unit and determining the at least one characteristic value for an apparent charge in dependence on the measurement signal of the fourth coupling unit.

The described calibration can be used analogously for the testing device.

According to the improved concept, in addition a testing arrangement is indicated which comprises a testing device according to the improved concept as well as the shielded cable. The components, which are connectible with the cable, of the testing device are connected with the cable.

Further forms of embodiment and implementations of the testing system are evident directly from the different forms of embodiment of the method for measuring partial discharge pulses. In particular, individual or several of the components and/or arrangements, which are described with respect to the method, for performance of the method can be correspondingly implemented in the test system.

The present invention is explained in detail in the following by way of exemplifying forms of embodiment with reference to the drawings. Components which are functionally identical or have an identical effect can be provided with identical reference numerals. Identical components or components with identical functions are in certain circumstances explained only with reference to the figure in which they first appear. The explanation is not necessarily repeated in the succeeding figures.

A block circuit diagram of an exemplifying form of embodiment of a testing device according to the improved concept is shown in FIG. 1 as well as an equivalent circuit diagram of a shielded cable GK with which the illustrated testing device is here, by way of example, connected. The testing device of FIG. 1 can be used for a method according to the improved concept.

The cable GK includes an inner conductor, which is termed core and is illustrated in the equivalent circuit diagram by a series connection of a first conductor inductance LL1, a first conductor resistance RL1, a second conductor inductance LL2 and a second conductor resistance RL2. In addition, the cable GK has an electrically conductive sheath which is illustrated by a series connection of a first sheath inductance LS1, a first sheath resistance RS1, a second sheath inductance LS2 and a second sheath resistance RS2. The sheath and inner conductor are electrically isolated from one another, which is taken into consideration by a conductor/sheath capacitance CLS as well as a conductor/sheath resistance RLS, which is arranged parallel thereto, in the equivalent circuit diagram. The conductor/sheath capacitance CLS and conductor/sheath resistance RLS are, for example, arranged between the series connections which the core and the sheath, respectively, represent. The equivalent circuit diagram therefore corresponds, by way of example and without limitation, with a cable GK open at one end. Alternatively, a termination of the cable, for example by an end closure or a water end closure and/or an additional high-voltage capacitor, is possible.

The core has a first connection point AL1 which, by way of example, is arranged at a first end of the cable. The sheath has a first connection point AS1 and a second connection point AS2, which, by way of example, are arranged at the first end and second end, respectively, of the cable.

The testing device includes a high-voltage source HV, a coupling capacitor KK, an evaluating unit A and, by way of example, a first coupling unit K1, a second coupling unit K2 and a third coupling unit K3. An output of the high-voltage source HV is connected with the first connection AL1 of the core and with a first connection of the coupling capacitor KK. A second connection of the coupling capacitor is connected with an input E of the first coupling unit K1, the reference connection R of which is connected with ground potential. As a result, a coupling branch consisting of the series connection of coupling capacitor KK and first coupling unit K1 is formed. The inputs E of the second coupling unit K2 and third coupling unit K3 are connected with the first connecting point AS1 and second connecting point AS2, respectively, of the sheath. The reference connections R of the second coupling unit K2 and third coupling unit K3 are connected with ground potential, whereby a first measuring branch and a second measuring branch are formed. Signal outputs S of the coupling units K1, K2 and K3 are connected with the evaluating unit A. The testing device can optionally include further coupling units connected with further connecting points of the sheath.

The high-voltage source HV is arranged to generate, at its output, a test voltage having the consequence of a test current which is divided between the coupling branch and cable GK, as indicated by arrows. The test current is determined substantially by the conductor/sheath capacitance CLS. The conductor/sheath resistance RLS of the insulating dielectric between core and sheath is very high, so that only a negligible part of the test current flows by way of it.

The coupling capacitor KK is constructed as a high-voltage capacitor and includes, for example, a plurality of capacitor windings connected in series. The capacitor windings are formed as, for example, wound layers on a dielectric with two conductive foils. The coupling capacitor KK is illustrated in FIG. 1 by an exemplifying equivalent circuit diagram. Connections between the capacitor windings and from the capacitor windings to the connections of the capacitor are taken into consideration by a series connection consisting of a connecting inductance LK and a connecting resistance RK. Connected in series therewith is the capacitance CK, which is formed by the dielectric, of the capacitor. The self-inductance of the capacitor winding LI is connected in parallel with the capacitance CK of the capacitor.

If a partial discharge, PD, arises in the cable GK, particularly in the electrical insulation between the sheath and core, this leads to, especially, a high-frequency and/or transient partial discharge current or pulse not only in the coupling branch, but also in all measuring branches. The coupling units K1, K2 and K3 have, for example, an inductive element between the input E and reference connection R and behave inductively in the frequency range of the PD pulse, so that they have a blocking effect particularly for signals in the high two-digit and three-digit KHz range. Through the introduction of the coupling units K1, K2 and K3 between the sheath and core not only the measuring branches, but also the branch formed by the first conductor inductance LL1, the conductor/sheath capacitance CLS, the second sheath inductance LS2 and the intrinsic inductance of the third coupling inductance K3 have a high impedance and a corresponding blocking effect for PD pulses. The PD current thereby flows in a particularly high proportion through the coupling capacitor KK, which leads to improved measuring sensitivity.

In other words, the PD current divides between the measuring branches in an especially favourable manner for precise measurement, since all measuring branches and the coupling branch have a coupling unit. The sheath is then earthed not directly like the coupling capacitor KK, but by way of one of the coupling units K2 and K3 with its respective intrinsic inductance.

Figure 2A:
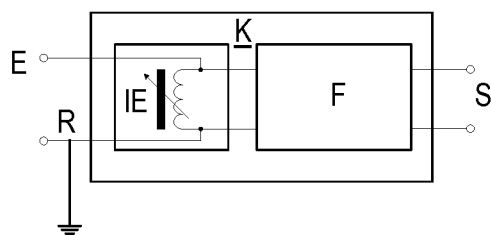
FIG. 2A shows a block circuit diagram of an exemplifying form of a coupling unit for a testing device or a method according to the improved concept.

FIG. 2A shows a block circuit diagram of an exemplifying embodiment of a coupling unit K for a testing device or a method according to the improved concept.

The coupling unit K is constructed as a measuring impedance. It includes an inductance IE, which is preferably adaptable, as well as a filter element F downstream of the inductance IE.

By way of example, the filter element F is formed as a filter network, for example as an RLC network, which can optionally adapt its transfer function. The coupling unit K has an input E and a reference connection R, between which the inductance IE is connected, as well as a signal output S for output of a measurement signal. The coupling unit K is here, by way of example, arranged for issue of a differential signal at two connections of the signal output S.

Figure 2B:
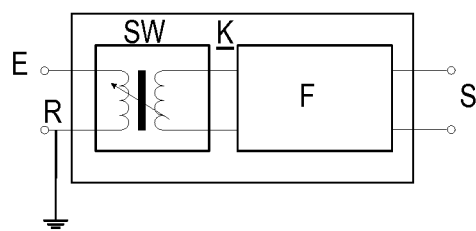
FIG. 2B shows a block circuit diagram with a further exemplifying embodiment of a coupling unit for a testing device or a method according to the improved concept.

FIG. 2B shows a block circuit diagram of a further exemplifying embodiment of a coupling unit K for a testing device or a method according to the preferred concept.

The coupling unit K includes a current converter SW, which is constructed as, for example, a high-frequency current converter, i.e. high-frequency current transformer (HFCT), and represents the inductive element of the coupling unit K. The current converter SW can then be constructed as, for example, a straight-through converter with a primary winding number of 1.

The coupling units K shown in FIGS. 2A and 2B can be used as coupling units in a testing device or in a method according to the improved concept.

Figure 3:
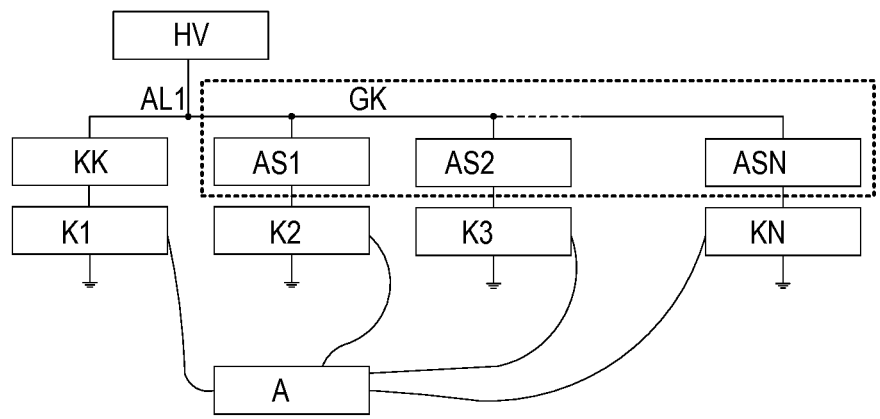
FIG. 3 shows a schematic illustration of a further exemplifying form of embodiment of a testing device according to the improved concept with a shielded cable.

FIG. 3 shows a schematic illustration of a further exemplifying form of embodiment of a testing device according to the improved concept as well as a shielded cable GK with which the illustrated testing device is here, by way of example, connected.

The shielded cable GK has a first connecting point AL1 of the core and a plurality N of connecting points AS1, AS2 . . . ASN of the sheath, of which three are illustrated. As indicated by the dashed-line interruption, the cable GK can have further connecting points of the sheath.

As in FIG. 1, the high-voltage source HV and the series connection of coupling capacitor KK and first coupling unit K1 are connected with the first connecting point AL1 of the core. The testing device includes a plurality of further coupling units K2, K3, . . . KN, of which by way of example three are shown and which are each connected by a respective input with one of the connecting points AS1, AS2, . . . ASN of the sheath and by a respective reference connection with a reference potential, for example a ground potential. The evaluating unit A is connected with an associated signal output of each of the coupling units.

A multi-channel measuring method can be used by this arrangement, as described further above for the method according to the improved concept, which can, in particular, be calibrated in accordance with IEC 60270. The cable is effectively divided into a plurality of cable branches between the connecting points AS1, AS2, . . . ASN, AL1 of the sheath and the core. A test current flowing in the cable branches and in the coupling branch is dependent on the test voltage as well as on the respectively effective capacitances. In the case of frequencies in the three-digit Hz range the test construction has substantially capacitive behaviour. In the frequency range of a broad-band PD measurement in accordance with IEC 60270, for example in the three-digit kHz range and the range lying thereabove, a negligible distributed inductance of the cable GK is effective at low frequencies.

Through use of the method according to the improved concept a particularly high measuring sensitivity and accuracy is thus made possible.

A method and a testing device for highly sensitive PD measurement at shielded cables or other objects with distributed elements is indicated by the improved concept, whereby an increased sensitivity can be achieved. A basic disturbance level of the PD measurement can be significantly reduced. PD occurring at a large spacing from the first end of the cable can be detected significantly more satisfactorily. Through the less evident signal dispersion, a more accurate fault location is possible.

The improved concept was here described for shielded cables. However, analogous use on other objects with distributed elements, for example distributed capacitances, inductances and/or resistances, is readily possible for the expert and offers corresponding advantages as in the case of use at shielded cables. Such objects with distributed elements can be, for example, high-voltage capacitors, extended gas-insulated switching plants (GISP) or high-voltage lead-throughs.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SYMBOLS

HV high-voltage source
GK shielded cable
KK coupling capacitor
A evaluating unit
K1, K2, K3, KN, K coupling units
AS1, AS2, ASN connecting points of the sheath
AL1, AL2 connecting points of the core
RK connection resistance
LK connection inductance
LI self-inductance of the capacitor winding
CK capacitance of the coupling capacitor
LS1, LS2 sheath inductances
RS1, RS2 sheath resistances
LL1, LL2 conductor inductances
RL1, RL2 conductor resistances
CLS conductor/sheath capacitance
RLS conductor/sheath resistance
IE inductive element
SW current converter
F filter element
E input
R reference connection
S signal output

The invention claimed is:

1. A method for measuring partial discharge pulses of a shielded cable, the shielded cable comprising a core and a sheath, the method comprising:
connecting a coupling capacitor with a first connecting point of the core;
providing coupling units, which comprise a first coupling unit, a second coupling unit, and a third coupling unit, the coupling units each having an input and a signal output;
connecting the input of the first coupling unit with the coupling capacitor;
connecting the input of the second coupling unit with a first connecting point of the sheath;
connecting the input of the third coupling unit with a second connecting point of the sheath;
providing a test voltage at the first connecting point of the core;
acquiring respective measurement signals of the coupling units at the signal output of each of the coupling units; and
determining at least one characteristic value for an apparent charge of a partial discharge pulse of the cable in dependence on the measurement signals.

2. The method according to claim 1, wherein the determination of the at least one characteristic value for the apparent charge comprises:
weighting the measurement signal of the first coupling unit;
weighting the measurement signal of the second coupling unit and/or the measurement signal of the third coupling unit;
generating a difference signal:
by subtraction of the weighted measurement signal of the second coupling unit and/or third coupling unit from the weighted measurement signal of the first coupling unit, or
by subtraction of a digitalised weighted measurement signal of the second coupling unit and/or third coupling unit from a digitalised weighted measurement signal of the first coupling unit; and
determining a first characteristic value for the apparent charge from the difference signal.

3. The method according to claim 2, wherein the determination of the first characteristic value for the apparent charge from the difference signal comprises integration at least of a part of the difference signal or of a signal derived from the difference signal.

4. The method according to claim 1, wherein the determination of the at least one characteristic value for the apparent charge comprises determination of at least one second characteristic value for the apparent charge from the measurement signal of the second coupling unit and/or the measurement signal of the third coupling unit.

5. The method according to claim 4, wherein the determination of the at least one second characteristic for the apparent charge comprises:
weighting the measurement signal of the second coupling unit and the measurement signal of the third coupling unit;
generating a summation signal by addition of the weighted measurement signals of the second coupling unit and the third coupling unit, or of the Fourier spectra of the weighted measurement signals of the second coupling unit and the third coupling unit; and
determining the second characteristic value for the apparent charge from the summation signal.

6. The method according to claim 1, further comprising:
providing a fourth coupling unit having an input and a signal output;

connecting a further coupling capacitor with a second connecting point of the core and of the input of the fourth coupling unit with the further coupling capacitor;

acquiring a measurement signal of the fourth coupling unit at the signal output of the fourth coupling unit; and determining a third characteristic value for the apparent charge in dependence on the measurement signal of the fourth coupling unit.

7. The method according to claim 6, wherein the determination of the third characteristic value for the apparent charge comprises:

weighting the measurement signals of the third coupling unit and the fourth coupling unit;

generating a further difference signal:
by subtraction of the weighted measurement signal of the third coupling unit from the weighted measurement signal of the fourth coupling unit, or
by subtraction of a digitalised weighted measurement signal of the third coupling unit from a digitalised weighted measurement signal of the fourth coupling unit; and determining the third characteristic value for the apparent charge from the further difference signal.

8. The method according to claim 1, further comprising:
determining a first transit time from the measurement signal of the first coupling unit and/or the measurement signal of the second coupling unit;
determining a second transit time from the measurement signal of the third coupling unit; and
localizing a partial discharge of the cable based on the first transit time and/or the second transit time.

9. The method according to claim 1, further comprising:
generating a correlated signal by formation of a cross-correlation between the measurement signal of the first coupling unit and the measurement signal of the third coupling unit, or between the measurement signal of the second coupling unit and the measurement signal of the third coupling unit;
determining a transit time from the correlated signal; and
localizing a partial discharge of the cable based on the transit time.

10. The method according to claim 1, further comprising calibrating at least one of the coupling units prior to the steps of providing the test voltage, acquiring the measurement signals, and determining the at least one characteristic value.

11. The method according to claim 10, wherein the coupling units each have a reference connection connected with a reference potential, and the calibration comprises:
generating a calibration pulse between the first connecting point of the core and the reference potential, or between the first connecting point of the core and the inputs of one of the coupling units or between a further connecting point of the core and the inputs of the coupling units;
acquiring a calibration signal at the signal output of one of the coupling units;
determining a test value for the apparent charge of the calibration pulse from the calibration signal; and
determining a calibration factor for the coupling unit, at the signal output of which the calibration signal was acquired, by comparison of the test value with a reference value for the apparent charge of the calibration pulse.

12. A testing device for measurement of partial discharge pulses of a shielded cable, the shielded cable comprising a core and a sheath, the testing device comprising:
coupling units, which comprise a first coupling unit, a second coupling unit, and a third coupling unit each having an input and a signal output, the input of the second coupling unit being configured to connect with a first connecting point of the sheath and the input of the third coupling unit being configured to connect with a second connecting point of the sheath;
a high-voltage source with an output for connection of the high-voltage source with a first connecting point of the core and for provision of a test voltage at the output;
a coupling capacitor connected with the output of the high-voltage source, wherein the input of the first coupling unit is connected with the coupling capacitor; and
an evaluator connected with the signal outputs of each of the first coupling unit, the second coupling unit, and the third coupling units,
wherein the evaluator is configured to receive the associated measurement signals from the signal output of each of the coupling units and configured to determine at least one characteristic value for an apparent charge of a partial discharge pulse of the cable in dependence on the measurement signals.

13. The testing device according to claim 12, wherein each of the coupling units has a reference connection connected with a reference potential, and:
includes an inductive element which is arranged between the input and reference connection of the respective one of the coupling units; and/or
includes a filter element which is arranged between the input and signal output of the respective one of the coupling units.

14. The testing device according to claim 13, wherein the filter elements of the coupling units are adaptive filter elements and are configured to adapt the respective frequency response thereof to the shielded cable in such a way that transfer functions of a first measurement branch and second measurement branch as well as of a coupling branch are matched to one another.

15. The testing device according to claim 14, further comprising:
a fourth coupling unit having an input and a signal output; and
a further coupling capacitor connectible with a second connecting point of the core, wherein the input of the fourth coupling unit is connected with the further coupling capacitor,
wherein the evaluator is configured to receive a measurement signal from the signal output of the fourth coupling unit and configured to determine the at least one characteristic value for an apparent charge in dependence on the measurement signal of the fourth coupling unit.

* * * * *